(12) United States Patent
David et al.

(10) Patent No.: US 7,858,268 B2
(45) Date of Patent: Dec. 28, 2010

(54) METHOD FOR GENERATING A CIRCULAR PERIODIC STRUCTURE ON A BASIC SUPPORT MATERIAL

(75) Inventors: Christian David, Lauchringen (DE); Harun Solak, Brugg (CH)

(73) Assignee: Eulitha AG, Villigen PSI (CH)

( * ) Notice: Subject to any disclaimer, the term of this patent is extended or adjusted under 35 U.S.C. 154(b) by 1049 days.

(21) Appl. No.: 10/540,754

(22) Filed: Jun. 24, 2005

(65) Prior Publication Data

US 2006/0098566 A1 May 11, 2006

Related U.S. Application Data

(63) Continuation of application No. PCT/EP2003/010233, filed on Sep. 15, 2003.

(30) Foreign Application Priority Data

| Feb. 14, 2003 | (EP) | ................................. 03003392 |
| Apr. 1, 2003 | (EP) | ................................. 03007559 |
| May 27, 2003 | (EP) | ................................. 03011888 |

(51) Int. Cl.
*G03F 1/00* (2006.01)
*G03C 5/00* (2006.01)
*G02B 5/18* (2006.01)

(52) U.S. Cl. ........................... 430/5; 430/394; 359/569; 369/285

(58) Field of Classification Search ..................... 430/5, 430/296, 394; 369/284, 285
See application file for complete search history.

(56) References Cited

U.S. PATENT DOCUMENTS

| 4,360,586 A | 11/1982 | Flanders et al. |
| 5,415,835 A | 5/1995 | Brueck et al. |
| 5,467,166 A * | 11/1995 | Shiraishi ...................... 355/71 |
| 5,715,039 A * | 2/1998 | Fukuda et al. ................ 355/53 |
| 6,309,809 B1 * | 10/2001 | Starikov et al. ............. 430/395 |
| 6,344,298 B1 * | 2/2002 | Starodubov et al. ............ 430/5 |
| 2002/0118456 A1 * | 8/2002 | Hasman et al. ............. 359/484 |
| 2004/0157086 A1 * | 8/2004 | Hwang et al. ............... 428/693 |

FOREIGN PATENT DOCUMENTS

| EP | 0 352 975 A2 | 1/1990 |
| WO | WO 98/12603 | 3/1998 |

* cited by examiner

*Primary Examiner*—Mark F Huff
*Assistant Examiner*—Jonathan Jelsma
(74) *Attorney, Agent, or Firm*—Laurence A. Greenberg; Werner H. Stemer; Ralph E. Locher

(57) ABSTRACT

The present invention is directed to a method for the generation of periodic curved structures in a basic support material such as the basic layer for the magnetic bit cells of a magnetic storage device. The method includes the steps of generating a number of diffraction masks such that each mask comprises at least one transmission diffraction gratings having at least one of a different periodic concentric circular pattern, spiral-like periodic pattern and periodic radial spoke pattern; positioning at least one of the diffraction masks simultaneously or successively in a certain distance of the basic support material to be patterned, the distance being mask dependent; exposing the basic support material by directing light beams through each of the diffraction masks; and interfering the different light beams diffracted by the gratings on each mask in order to generate coincident light intensity patterns on the surface of the basic support material.

7 Claims, 5 Drawing Sheets

METHOD FOR GENERATING A CIRCULAR PERIODIC STRUCTURE ON A BASIC SUPPORT MATERIAL

CROSS REFERENCE TO RELATED APPLICATIONS

The present application is a continuation of International Application PCT/EP2003/010233, filed Sep. 15, 2003 and further claims priority to European patent applications 03003392.2, 03007559.2 and 03011888.9, filed Feb. 14, 2003, Apr. 1, 2003 and May 27, 2003 respectively, all of the aforementioned incorporated herein by reference.

BACKGROUND OF THE INVENTION

The invention relates to a method for generating a periodic circular structure in a basic support material, such as for patterning a basic layer for the magnetic bits of a magnetic disk media.

Magnetic recording devices in the form of circular discs coated uniformly with thin films of magnetic materials are used in many information systems. The data is recorded as magnetic bits in the thin film media. A magnetic bit means an area of the film that has been mainly magnetized in a direction by a writing head. The bits are read by a reading head which is sensitive to the magnetization orientation of the bits. The disc rotates usually around an axis perpendicular to the surface of the disc. During the rotation the write and/or read operations are performed. Therefore, the magnetic bits are positioned on circular tracks around the rotational axis.

The areal density of data stored on this kind of magnetic storage disks (i.e. so-called hard disks) has increased with an average annual growth range of about 60 to 100% each year since the early 90's. This tremendous growth rate allowed lower costs per stored bit and higher speed of data access. Storage devices having an areal density of about 60 Gbits/inch$^2$ are expected to be offered in the market in the near future, i.e. second half of 2003.

Consequently, the increase of the areal density can only be achieved by a decrease of the size of a magnetic bit cell. For example, a 100 Gbits/inch$^2$ generation will require a size of a magnetic bit cell to be approximately 80×80 nm$^2$ assuming a square shaped bit cell. The magnetic bit cell in a thin film crystalline media may contain several tens to hundreds of magnetic grains. A respectable number of grains is required in order to allow an acceptable signal to noise ratio for each magnetic bit cell. Therefore, as far as the size of the magnetic bit cell has to decrease for the sake of higher areal densities, the size of grains must become smaller as well. However, the level of minimization will touch physical limits due to the so-called super-paramagnetic limit which is touched when the size of grains become too small to retain its magnetization at room temperature for a sufficient period of time.

A potential solution for the problem is to use instead of a continuous thin film media a patterned media where each magnetic bit cell is formed as a lithographically defined magnetic element. These elements behave as single oriented magnetic domains being stable at room temperature. Moreover, each of these lithographically defined magnetic elements can be individually switched and read. An added advantage is that the transitions from one magnetic state to another one are much sharper than those in a continuous medium. It is required to arrange these magnetic elements in periodic arrays to be synchronized with the read/write signal.

A major obstacle to the realization of a patterned magnetic storage media is the difficulty of a mass production of a suitable patterned substrate at an acceptable cost. The considerably high areal density above 100 Gbits/inch$^2$ requires bit sizes to be well below 100 nm in length and/or width. Therefore, in a suitable production technique, large areas have to be patterned having a comparably high resolution of the periodic structure at acceptable throughput and cost. Electron beam lithography is capable of producing such patterns but the throughput is far from being acceptable. Laser interference lithography has long been regarded as a possible technique as it can create periodic patterns over comparably large areas. However, up to now interference lithography has been shown to create only linear periodic structures such as arrays of lines or arrays of dots on square, rectangular or hexagonal grids.

SUMMARY OF THE INVENTION

Therefore, it is the aim of the invention to provide a method allowing to generate periodic curved structures overcoming these afore-mentioned limitations.

This aim is achieved according to the invention by a method for generating a periodic circular structure in a basic support material, such as a support layer for a patterned magnetic storage device, comprising:

A method for generating a periodic circular structure in a basic support material, such as a layer for magnetic bit cells (14) for a magnetic storage device, comprising:
  a) generating a number of diffraction masks with each mask having at least one transmission diffraction gratings (4, 6, 8, 20 to 34) each transmission diffraction grating (4, 6, 8, 20 to 34) having a different periodic concentric circular pattern and/or spiral-like periodic pattern and/or periodic radial spoke pattern;
  b) positioning of one or more of said diffraction masks simultaneously or successively in a certain distance of the basic support material (12) to be patterned, with the distance depending on the mask;
  c) applying light beams through each of the diffraction masks for exposing the basic support material (12) to said light beam; and
  d) interfering the different light beams diffracted by the gratings on each mask in order to generate coincident light intensity pattern on the surface of the basic support material (12).

This new and inventive interference technique allows creation of periodic curved structures such as concentric circular tracks and periodic arrays of dots on circular tracks are achievable. This technique significantly relies on transmission diffraction masks having diffraction gratings that can be patterned by known lithographic techniques including electron beam lithography. This technique retains most of the main advantages of interference lithography such as high spatial resolution, large depth of focus, large pattern area, simplicity of the optical equipment and set up, coherence of the achieved pattern etc.

In accordance with an optional feature of the invention for exposing the basic support material a multiple exposure process is used, comprising: using a transmission diffraction mask having a periodic circular interference mask pattern in order to generate necessary exposure for circular tracks on the basic support material; and using afterwards a transmission diffraction mask having a spiral extending interference mask pattern or having a radial extending interference mask pattern (spoke pattern) in order to generate necessary exposure for a circumferential partitioning of said circular tracks; or vice versa. In a multiple exposure scheme the pattern is a result of the total dose pattern delivered to the basic support material.

Individual exposure steps may or may not deliver sufficient dose to the support material to create patterns of their own.

An alternative multiple exposure process for exposing the basic support material may provide a multiple exposure process, comprising: using a first transmission diffraction mask having a combined circular and spiral interference mask pattern in order to generate necessary exposure for a first spiral track pattern on the basic support material; and using afterwards a second transmission diffraction mask having a similar combined circular and spiral extending interference mask pattern but having the spiral component oriented in the opposite direction in comparison with the first transmission diffraction mask in order to generate necessary exposure for a partitioning of said generated first spiral track pattern by intersecting the first and the second spiral track pattern.

Both the two processes as given above are interesting options for accommodating the inventive idea to practice.

In order to create diffracted beams, the transmission diffraction masks are either of absorption or of phase shifting type or a combination of the two types. Whereby it may be remarked that the throughput is higher using the phase shifting type since the diffraction efficiency and hence the use of the light from the light source is more efficient. Another advantage of using a phase mask is that the risk of damaging the mask at high fluences is minimized since no or little light is absorbed by the mask itself.

As far as the polarization of the incident light is important in the diffraction of light by the transmission diffraction masks (gratings), linearly polarized light may cause non uniformities along the circumferential direction in the created pattern. Therefore, a light source having a circular polarization and/or a linear polarization whereby the polarization plane of the light varies over the exposure time may be used to avoid such non-uniformities.

With respect to the storage density achievable according to the invention suitable light sources are necessary having a wavelength in the range of 5 to 500 nm, i.e. in the range from optical lasers to synchroton radiation sources. For example, lasers with 193 nm wavelength are currently used for lithography processes in the semiconductor industry. Lasers with 157 nm wavelength are expected to be used for smaller architectures in the future. With the latter, light source, interference lithography will find entrance into dimensions less than 100 nm feature size. With respect to shorter wavelengths, synchroton radiation provides spatially coherent radiation with wavelengths down to 10 nm. In this range of wavelengths storage densities in the range of 10 Tbit/inch$^2$ seem to be possible.

In order to decrease the feature size using common laser light sources an immersion lithography process may be used, whereby an immersion liquid having a refractive index larger than 1 is disposed between the transmission diffraction mask and the basic support material. Assuming p.e. a laser light source having a wavelength of 157 nm and an immersion liquid with refractive index 1.37, a pattern period that approaches 55 nm can be expected. The corresponding storage density lays in the range of 210 Gbit/inch$^2$.

According to the selected structure of the transmission diffraction mask the gratings may be chosen in order to enable the partitioned circular periodic structure comprising cells having a length to width ratio other than 1. This type of elongated magnetic bit cells ensure that the elements have a certain long axis for easy magnetization and two well defined magnetic states oriented opposite to each other.

Other advantageous measures can be seen from the additional dependent claims.

BRIEF DESCRIPTION OF THE SEVERAL VIEWS OF THE DRAWINGS

Examples of the invention are described below with reference to the drawings which show in.

DETAILED DESCRIPTION OF THE INVENTION

Figure 1:
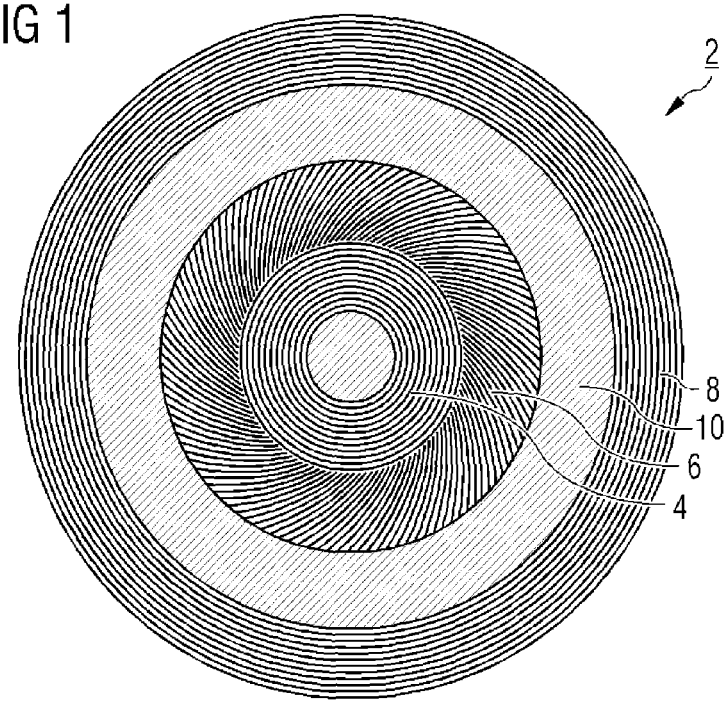
FIG. 1 a schematic layout of a first transmission diffraction grating configuration for creating an interference pattern with circular symmetry.
Figure 2:
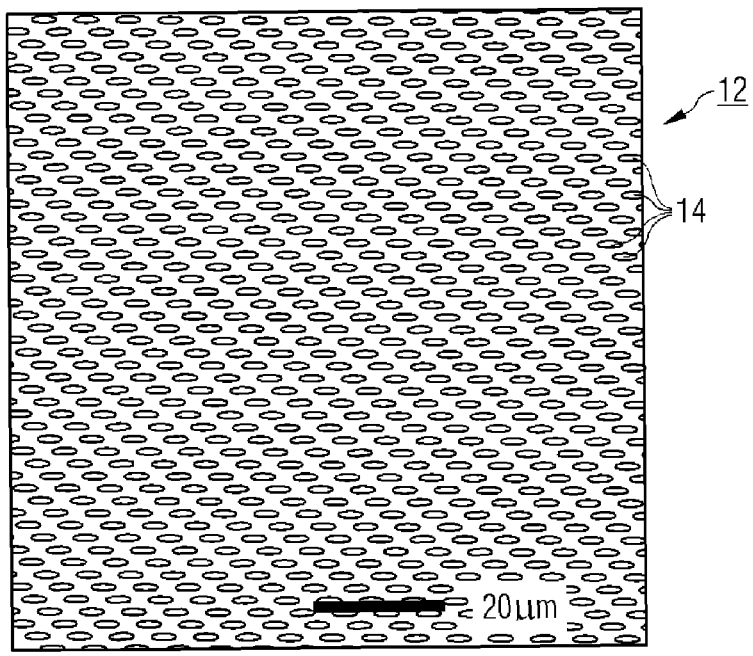
FIG. 2 an optical micrograph of an array of holes in a photoresist obtained with the transmission diffraction grating configuration shown in FIG. 1.

Generally, the method for generating a circular periodic structure for magnetic storage media starts with the design of a suitable number of transmission diffraction gratings. At least two of those gratings will create the desired interference pattern when illuminated by spatially coherent light. FIG. 1 therefore shows a schematic layout of a first transmission diffraction grating configuration 2 which comprises three different types of transmission diffraction gratings 4, 6 and 8. These gratings 4, 6 and 8 have the design to generate a pattern of periodic partitioned dots 14 on circular tracks. When illuminated with spatially coherent light this mask design yields an interference pattern with periodic intensity peaks along circular tracks as shown in FIG. 2 that depicts an optical micrograph of an array of holes (dots) 14 in a photoresist layer 12 obtained with the first transmission diffraction grating configuration 2. The holes/dots 14 are positioned along circular tracks running parallel to the long axis of the oval shaped holes 14. The radius of the curvature of the tracks is about 6 mm so that the track curvature is not noticeable at magnifications large enough to resolve individual holes 14 as shown in FIG. 2.

The desired pattern on the photoresist layer 12, disposed on a suitable substrate, is obtained in this example by the interference of three mutually coherent beams of laser light. This periodic light pattern can then be used to create patterned magnetic bit cells with the desired circular symmetry in a single exposure step.

The light beams diffracted by the three transmission diffraction gratings 4, 6 and 8 coincide in a region 10 at a certain distance from the diffraction masks to form the desired interference pattern. The gratings 4 and 8 are designed to define circular tracks in the radial direction whereas the spiral grating 6 is designed to define the partition of the circular tracks into individual intensity peaks along the circumferential direction. Even though, the functions of these three transmission gratings 4, 6 and 8 seem to be distinct, they are in this example required to be present simultaneously to obtain the desired interference pattern. Possible variations in the design of the gratings as shown in FIG. 1 include exchanging the relative radial locations of the different gratings 4, 6 and 8. The spatial periods of the gratings, their diameters, the angle (theoretically between 0 and 90°, preferably between 20 to 70°) of the spiral-like grating with respect to the radial direction can all be changed according to the application requirements, i.e. the desired storage density, size of the patterned region etc. The number of gratings can also be varied to obtain interference of two, three or four beams. Even a larger number may not be excluded.

Figure 3A:
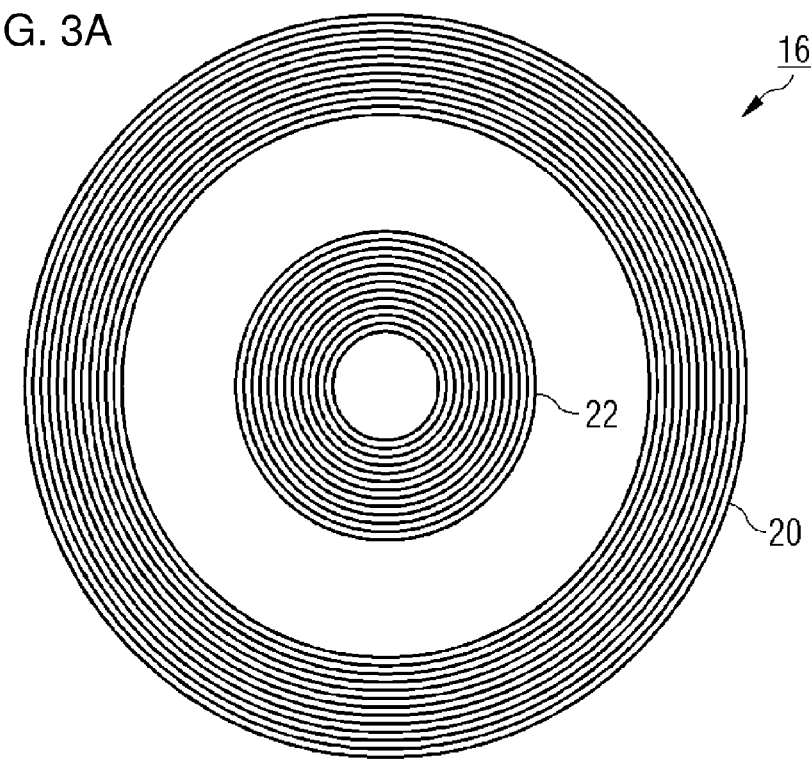
FIGS. 3A and 3B are schematic layouts of a second transmission diffraction grating configuration on two masks which can be used in a double exposure process.

A promising possibility is the use of a multiple exposure process in order to obtain the desired pattern. Therefore, a second and a third transmission diffraction grating configuration 16 resp. 18 in FIG. 3 resp. 4 are shown to support this possibility. For example, a basic support material can be exposed first with two transmission diffraction gratings 20, 22 having circular patterns in order to obtain necessary exposure for circular tracks (FIG. 3*a*). This first exposure step is followed by a second exposure step using two transmission diffraction gratings 24, 26 having spiral gratings in order to obtain necessary exposure for a circumferential partitioning of the circular tracks obtained by the first exposure step.

Figure 4A:
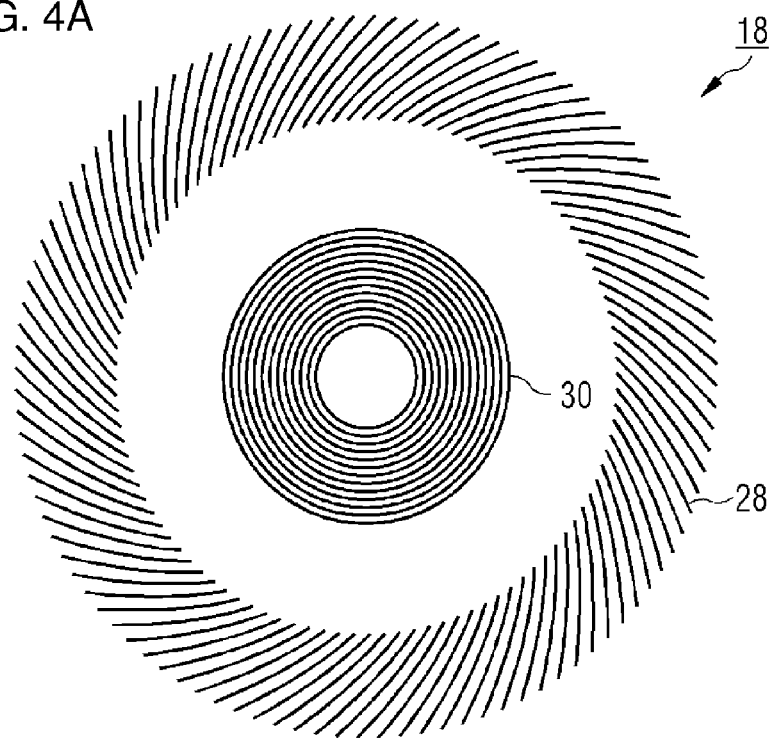
FIGS. 4A and 4B are schematic layouts of a third transmission diffraction grating configuration on two masks which can be used in a double exposure process.
Figure 4B:
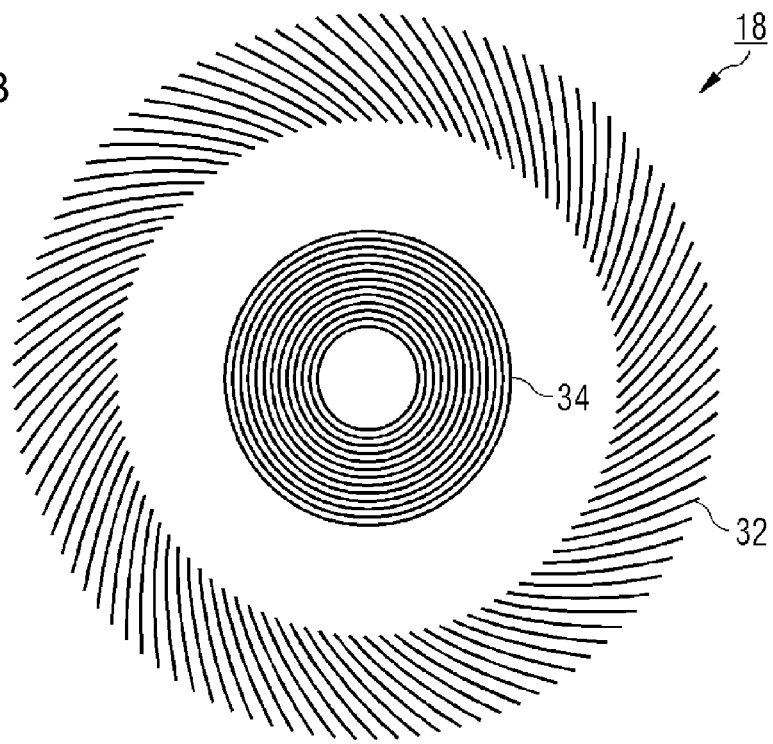

Another possible multiple exposure process scheme includes according to the third transmission diffraction grating configuration 18 in FIG. 4 a first exposure step with two transmission diffraction gratings 28, 30 having a combined circular and spiral grating in order to obtain necessary exposure for a first track pattern. In a second exposure step, two gratings 32, 34 having a combined circular and spiral grating, too, are used to obtain necessary exposure for a partitioning of the first track pattern. For this purpose, the directions of the spiral grating of the transmission diffraction gratings 28 and 32 are oriented opposite to each other.

Figure 3B:
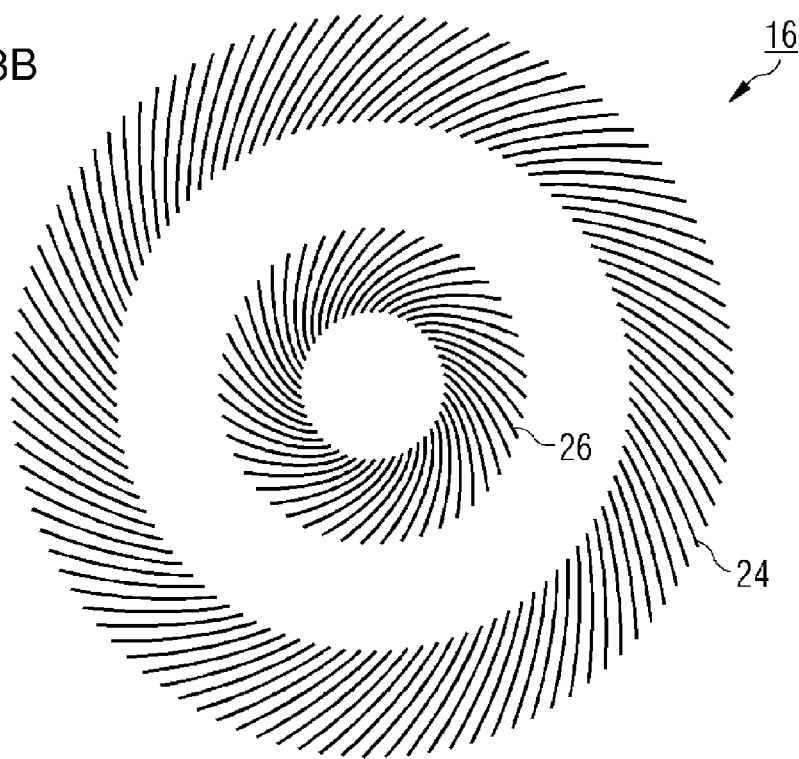
Figure 5A:
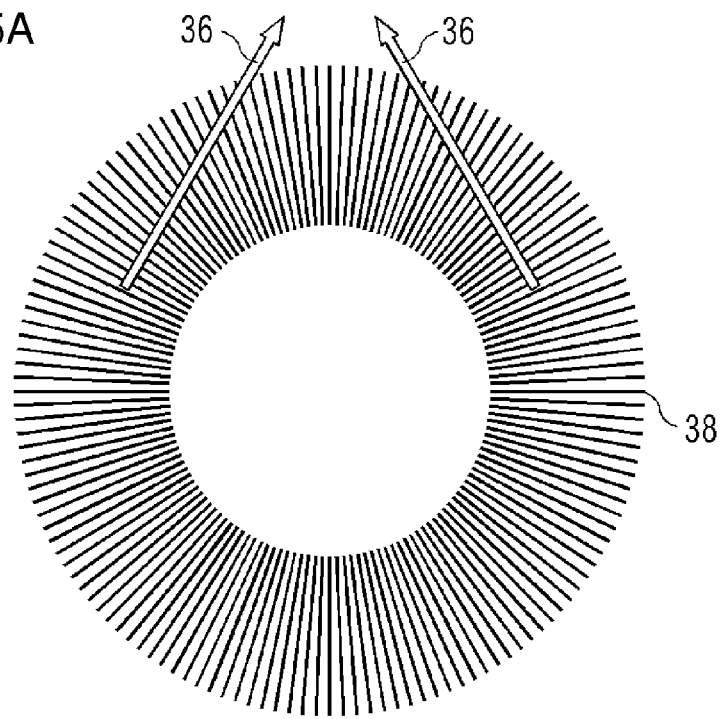
FIGS. 5A and 5B are schematic layouts of a fourth transmission diffraction grating configuration.

A fourth transmission diffraction grating configuration is shown in FIG. 5. FIG. 5*a* depicts beams 36 which are diffracted by a diffraction grating 38 in the shape of a spoke pattern. That means that the angle of the lines of a spiral grating (as shown in FIGS. 3 and 4) with respect to the radial direction becomes zero. The resulting pattern will also be a spoke pattern when using the interference between positive and negative diffraction orders from this grating 38. On a basic support material an interference pattern also in the shape of a spoke pattern is recorded. The spoke pattern obtained accordingly has twice the number of lines as the diffraction grating 38 used to create it. Such spoke pattern can additionally be used in angular encoders that are used to measure or control the angular position or speed of a rotary device. For this reason, the method may generally be applied in applications where such radial pattern are needed, including potentially the magnetic storage device. This example shows up with significant simplicity since only one diffraction grating 38 is required to generate the radial partitioning of the latter magnetic bit cell structure.

The magnetic bit cell structure then is generated in an interference zone 40 in which the beams 36 from the spoke-shaped diffraction grating 38 and beams 44 being diffracted by a periodic circular diffraction grating 42. Therefore, the radial spoke pattern is used in combination with a circular grating to create periodic interference peaks along circular tracks, as similar described above for the other example. The main advantage of this forth transmission diffraction grating configuration consists in the limited number of gratings and a much easier opportunity to avoid undesired diffraction orders in the interference zone 40.

Figure 6:
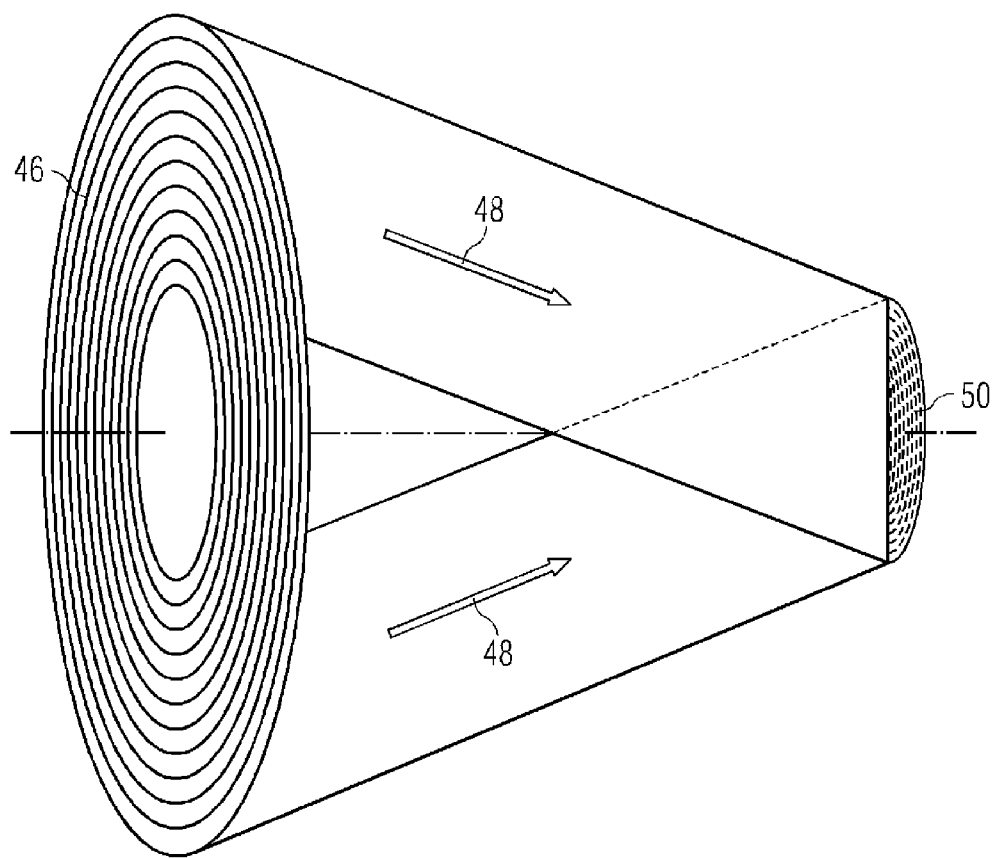
FIG. 6 a schematic view on a diffraction grating for generating a periodic circular pattern.

Periodic circular track pattern 50 can be printed by the interference of light beams 48 being created by a single circular diffraction grating 46 as shown in FIG. 6. The recorded pattern period is equal to half of the diffraction grating period. Again, a simplified technique is used requiring only one diffraction grating 46. Undesired diffraction orders are securely avoided. An additional advantage becomes apparent from FIG. 6, too. The obtained pattern 50 is not limited to an annular region 10 or 40 but the pattern 50 extends from a central focus point having a radius equal or close to zero.

Figure 5B:
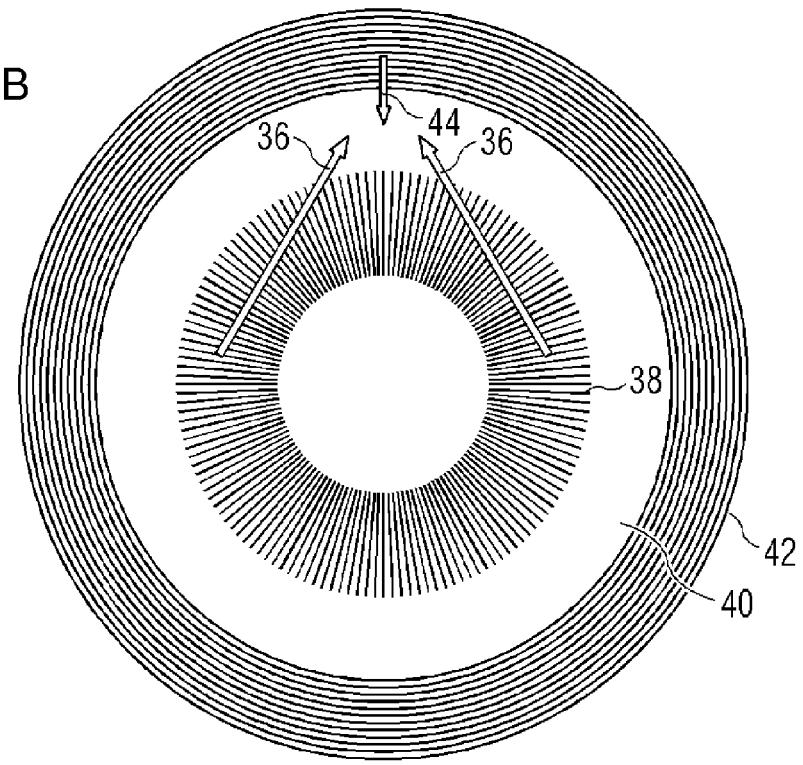

The described method yields a circular pattern in an annular region, such as the region 10 in FIG. 1 or the region (interference zone) 40 in FIG. 5*b*). In order to cover larger radial sections a multiple exposure process with different transmission diffractions masks can be used. This measure assists in maintaining a high spatial resolution in outer regions of the patterned area as the number of magnetic bit cells along the circumferential length is constant in the ensemble of circular tracks generated by one of the transmission diffraction grating configurations, such as the ones shown in FIG. 1 or 3 to 6.

The afore-mentioned technique can be considered as a form of replication process even though the pattern of the master (the transmission diffraction masks) and the replica (the circular pattern for magnetic bit cells) are rather different. A noteworthy advantage in this replication process is that the spatial frequency of the resultant circular pattern for the magnetic bit cells is higher than that of the transmission diffraction masks. A frequency multiplication by a factor between 1 and 2 is possible and often obtained. Therefore, the spatial resolution requirements in the manufacturing of the transmission diffraction masks are relieved with respect to the desired magnetic pattern resolution.

Additionally, this technique allows to generate a pattern having partitioned cells with a distinct length to width ratio. Elongated cells own the advantage that the cells have a certain long axis for easy magnetization, and two opposite well defined magnetization states.

The transfer of the interference intensity pattern generated by exposing light via the transmission diffraction masks to a basic support material for the latter storage device into the magnetic bit cell structure can be done in various ways. Well known lithographic techniques using photoresist films can be used. It shall be mentioned that in this regard the photoresist film is considered as the basic support material. The photoresist film itself can be disposed on a suitable carrier material, made from plastic, ceramic and/or metal which may or may not be already coated with the magnetic media to be patterned. In this patterning technique the photoresist film is exposed to the interference field. The pattern is created in the photoresist film after a development process where either the exposed or unexposed areas of the photoresist are dissolved depending on the tone of the photoresist (positive or negative resp.). The photoresist pattern is then transferred into a magnetic bit cell pattern using either a subtractive (dry or wet etching) or additive (lift-off or electroplating) process. Other possibilities include direct generation of the magnetic bit cell pattern by the influence of the interference light on the material to be patterned. For example, patterns of magnetic bit cells have been created by exposing the materials directly with laser beams and ion beams. Working without a photoresist has the general advantage in avoiding the dissolving process what means in particular that a possible damaging effects of the photoresist processing steps on the magnetic material is suppressed.

Additionally, a photoresist-less processing creates the magnetic bit cell pattern while maintaining the original smooth surface with no or to a very limited extend added topography. This is an important desired feature for patterned magnetic media since the magnetic read/write head hovers over the surface with an extremely small (several tens of nanometers) gap between the head and the spinning storage disc. Therefore, topographic features on the surface may disrupt the smooth hovering flight of the head or even collide with the head.

The interference lithography technique can be used in combination with the nanoimprint lithography. In that case, the circular interference lithography can be used to create stamps which can be later used in the nanoimprint process for mass replication. The advantage here is to produce the stamps in a much higher throughput process than using electron beam lithography. Unlike masks in photon based technique, the lifetime of a nanoimprint stamp is limited due to the contact nature of the process requiring a considerable number of stamps to be produced.

The interference process is able to create patterns having perfect periodicity properties which is of superior importance in the synchronization of the read/write signals. Well defined circular tracks may be used to create a sufficient feedback signal for the head to follow the tracks. This can be accomplished either by using the signal from the read head directly or by including additional elements on the head which picks up signal from several tracks in the adjacent vicinity.

What is claimed is:

1. A method for generating a periodic circular structure in a basic support material comprising the steps of:
   a) generating a plurality of diffraction masks such that each mask includes at least one transmission diffraction grating having at least one pattern selected from the group consisting of a periodic concentric circular pattern, a spiral-like periodic pattern and a periodic radial spoke pattern;
   b) positioning the plurality of the diffraction masks simultaneously or successively at a certain distance from the basic support material to be patterned, the distance being mask dependent;
   c) exposing the basic support material by directing light beams through each of the plurality of the diffraction masks; and
   d) interfering the different light beams diffracted by the grating on each mask in order to generate coincident light intensity patterns on the surface of the basic support material;
   wherein the step of exposing further comprises the steps of: generating said exposure using a first transmission diffraction mask having a combined circular and spiral interference mask pattern so as to generate a first spiral track pattern on the basic support material; and after said step of generating said exposure further generating said exposure using a second transmission diffraction mask having a combined circular and spiral extending interference mask pattern wherein said spiral component is oriented in an opposite direction to the first transmission diffraction mask, the second transmission effecting a partitioning of said generated first spiral track pattern by intersecting said first and said second spiral track pattern.

2. The method according to claim 1, wherein the diffraction masks are one of an absorption and phase shifting mask.

3. The method according to claim 1, wherein the light source generates light having a circular polarization or a linear polarization which varies with time.

4. The method according to claim 1, wherein the light source comprises a wavelength between 5 and 500 nanometers.

5. The method according to claim 4, further comprising the step of using an immersion lithography process for decreasing feature sizes, the lithography process having a refractive index larger than 1 and disposed between the transmission diffraction mask and the basic support material.

6. The method according to claim 1, wherein the periodic circular structure comprises cells having a length to width ratio larger than 1.

7. The method according to claim 1, wherein the basic support material comprises a layer for magnetic bit cells for a magnetic storage device.

* * * * *